Feb. 14, 1967 M. S. ULSTAD 3,304,511

GAIN STABILIZATION NETWORK FOR NEGATIVE RESISTANCE AMPLIFIER

Original Filed Oct. 16, 1961 2 Sheets-Sheet 1

INVENTOR.
MEREDITH S. ULSTAD

BY Moody & Gallagher

ATTORNEYS

GAIN STABILIZATION NETWORK FOR NEGATIVE RESISTANCE AMPLIFIER

Original Filed Oct. 16, 1961 2 Sheets-Sheet 2

INVENTOR.
MEREDITH S. ULSTAD
BY Moody & Gallagher
ATTORNEYS

United States Patent Office 3,304,511
Patented Feb. 14, 1967

3,304,511

GAIN STABILIZATION NETWORK FOR NEGATIVE RESISTANCE AMPLIFIER

Meredith S. Ulstad, Edina, Minn., assignor to Collins Radio Company, Cedar Rapids, Iowa, a corporation of Iowa Continuation of application Ser. No. 145,171, Oct. 16, 1961. This application May 27, 1965, Ser. No. 459,176
13 Claims. (Cl. 330—4.5)

This application is a continuation of application Serial No. 145,171 filed October 16, 1961.

This invention relates to a negative resistance amplifier and more particularly to a gain stabilization network for such an amplifier.

The negative resistance amplifier is, as is well known in the art, a device having terminals through which a signal may be received, boosted in power due to the negative resistance characteristics of the amplifier, and then coupled from the amplifier by means of the same terminals through which the signal was received. One of the more common devices that can be so utilized is a parametric amplifier.

In utilizing a negative resistance amplifier, a problem of stability arises, however, since this type of amplifier is very susceptible to variations in gain. This undesirable characteristic has rendered the negative resistance amplifier unsuitable, heretofore, for many purposes, such as, for example, where the bandwidth of a receiver is controlled by the gain of the negative resistance amplifier, or, again by way of example, where accurate signal strength measurements must be made.

It is therefore an object of this invention to provide a network for stabilizing the gain of a negative resistance amplifier and thereby enhance the utilization of this type of amplifier.

The stabilization problem is a negative resistance amplifier is readily shown, for example, by considering the gain characteristics of a parametric amplifier, which gain varies as a function of a parameter. While this particular parameter may be, by definition, directionly proportional to the negative resistance generated, the same cannot then be true with respect to gain since the amplifier gain depends not only upon the change in the parameter but also upon the initial value before change. A change in the parameter at a high value, for example, results in much greater change in gain than would the same change at a lower value.

Moreover, the stabilization problem is made still more complex due to the fact that the parameter itself is very sensitive to the power level of the control signal, which signal is commonly generated by a pump oscillator and coupled to the negative resitsance amplifier, as is well known in the art.

Thus, it can be readily appreciated that while a control signal may be utilized to determine the gain of a negative resistance amplifier, stabilization of this gain is complex since gain does not vary linearly over the utilized range of generated negative resistance produced by the control signal.

It is therefore another object of this invention to provide a system for stabilizing the gain of a negative resistance amplifier including means for automatically regulating the control signal to thereby constantly generate the proper negative resistance to maintain the gain of said negative resistance amplifier at a substantially constant level at all times.

More particularly, it is an object of this invention to provide a gain stabilization system having means for causing an input signal to be modulated with a reference signal of predetermined amplitude while being amplified in a negative resistance amplifier, means for detecting the amplified signal, and means for comparing said detected signal with said reference signal shifted in phase 180° to provide an error signal whenever the gain of said negative resistance amplifier varies from a predetermined value, which error signal causes the gain of said negative resistance amplifier to be adjusted to said predetermined value.

With these and other objects in view which will become apparent to one skilled in the art as the description proceeds, this invention resides in the novel construction, combination and arrangement of parts substantially as hereinafter described and more particularly defined by the appended claims, it being understood that such changes in the precise embodiment of the herein disclosed invention may be included as come within the scope of the claims.

The accompanying drawings illustrate one complete example of the embodiment of the invention according to the best mode so far devised for the practical application of the principles thereof, and in which.

Figure 1:
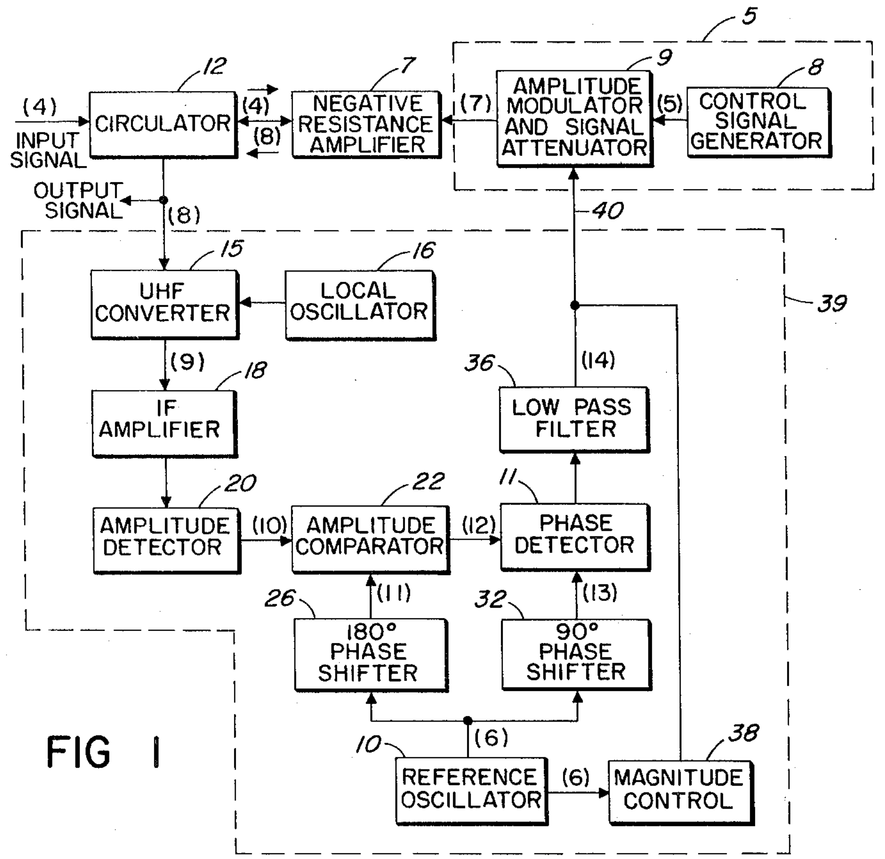
FIGURE 1 is a block diagram of the negative resistance amplifier gain stabilization network of this invention.

Referring now to the drawings, the numeral 5 indicates generally a gain varying unit for negative resistance amplifier 7. Gain varying unit 5 contains a control signal generator 8, and an amplitude modulator and signal attenuator 9. A control unit 39 receives the output from circulator 12 and feeds an error signal, via line 40, to gain varying unit 5. In operation, as the gain of amplifier 7 varies the input signal to control unit 39 also varies. This variation of this signal causes control unit 39 to generate an error signal, and feed said error signal to gain varying unit 5. Unit 5 then changes the gain of amplifier 7 according to the magnitude of said error signal to thereby stabilize the gain of amplifier 7, and in effect hold the gain constant, as is more fully described hereinafter.

Negative resistance amplifier 7, control signal generator 8, and amplitude modulator and signal attenuator 9 may all be conventional and may, for example, comprise a parametric amplifier, a pump oscillator (which may include a klystron tube, for example) and an electrically controlled ferrite attenuator, respectively. The operation of parametric amplifiers is fully described in an article entitled "Masers and Parametric Amplifiers" by Hubert Heffner published in The Microwave Journal for March 1959, pages 33 to 39.

Figure 3:
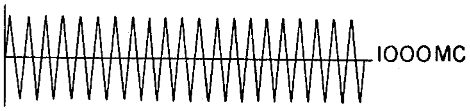
FIGURES 3 to 13 are a series of typical waveforms which may be present at selected points in the block diagram of FIGURE 1.

As shown in FIGURE 1, the output from control signal generator 8 is coupled to amplitude modulator 9 along with a second A.-C. signal from reference oscillator 10 and a D.-C. signal from phase detector 11. The output from modulator 9 is coupled to negative resistance amplifier 7 and determines the gain of said amplifier by controlling the negative resistance generated, as shown by the graph of FIGURE 3. Negative resistance amplifier 7 has common input and output terminals so that a signal coupled to the input is increased in power and then coupled from the amplifier through the same terminals.

A conventional three port circulator 12 may be connected so that a first port receives an input signal, which signal is then coupled from the circulator through the second port to negative resistance amplifier 7 where the signal is increased in power and coupled back into the circulator through the same second port. The signal is then coupled from the circulator through the third port. A circulator which functions in such a manner is fully described in U.S. Patent No. 2,717,360.

The output from the third port of circulator 12 is coupled to a conventional UHF converter 15 where the signal is mixed with the output signal from a conventional local oscillator 16. The IF output signal from converter 15 is then coupled through a conventional IF amplifier 18 to amplitude detector 20. While a linear detector might be utilized, it has been found preferable to utilize a logarithmic detector in that it eliminates the need for high order IF–UHF converter and amplifier gain stability which would, of course, be necessary if a linear detector were to be used.

The output from detector 20 is coupled to amplitude comparator 22, which comparator receives a second signal from conventional reference oscillator 10 through a conventional 180° phase shifter 26. As is conventional, if the amplitudes of the two input signals are equal there will be no output signal from comparator 22 since the signals cancel one another. If, however, these input signals should be of unequal magnitude then a difference output signal will be produced from the comparator, the phase, of course, being that of the larger signal.

The output signal from amplitude comparator 22 is coupled to conventional phase detector 11, which detector receives a second input signal from reference oscillator 10 through conventional 90° phase shifter 32. Since the input signal, if any, coupled from comparator 22 will be either leading or lagging the 90° shifted reference signal, the D.C. output from phase detector 11 will have a polarity reflecting the phase comparison. If the input signal from the comparator is zero, however, there will be no output from phase detector 11. The system will also function if 90° phase shifter 32 and the input from oscillator 10 to phase detector 11 are eliminated.

The D.C. output from phase detector 11 is coupled through a low pass filter 36 to the second input of amplitude modulator and signal attenuator 9 along with an A.C. reference signal from reference oscillator 10, as brought out hereinabove.

To assist in describing the system, the parenthesized numbers shown in FIGURE 1 represent FIGURES 4 to 13 and thereby indicate the voltage inputs to the various circuits of the system.

In operation, if an input signal, for example, of 1000 megacycles, as shown in FIGURE 3, is coupled to circulator 12, this 1000 megacycle signal will be coupled to negative resistance amplifier 7 where the power will be increased by a factor dependent upon the gain of the amplifier, which gain is, in turn, controlled by the negative resistance generated due to the signal coupled from amplitude modulator and signal attenuator 9.

Figure 4:
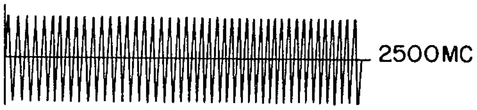
Figure 5:
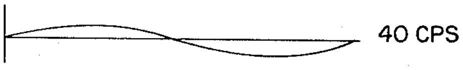
Figure 6:
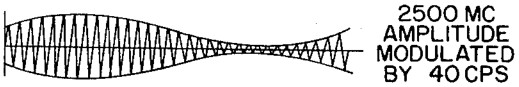

Since the signal from control signal generator 8, which may, for example, be 2500 megacycles, as shown by FIGURE 4, is modulated by the signal from reference oscillator 10, as shown by FIGURE 5, the output from modulator 9 coupled to the negative resistance amplifier is 2500 megacycles amplitude modulated by the 40 cycle per second signal, as shown by FIGURE 6. It is to be appreciated, of course, that FIGURES 3 to 13 of the drawings are meant only to be illustrative and no attempt has been made to reconcile frequencies with any exactness because of the wide ranges involved. Likewise, modulation of the various signals, which, in reality, is in terms of around one percent, has been shown herein at a much higher percentage for illustrative purposes.

Since modulator 9 is also an attenuator, the output signal will, however, be of smaller magnitude. In addition, and as shown in FIGURE 1, the magnitude of the signal from the reference oscillator may, if desired, be controlled by coupling the signal through a conventional magnitude control 38.

Figure 7:
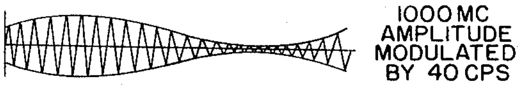

The modulator control signal coupled to the negative resistance amplifier causes the modulation to be impressed upon the signal being amplified so that, as shown by FIGURE 7, the 1000 megacycle signal when coupled from negative resistance amplifier 7 has a 40 cycle envelope.

Figure 8:
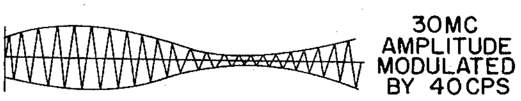
Figure 9:
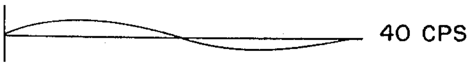
Figure 10:
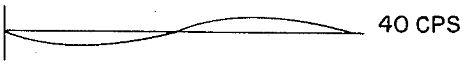

This signal is then coupled from the circulator to the converter where it is converted to an IF frequency of, for example, 30 megacycles as shown by FIGURE 8. The IF signal is then coupled to amplitude detector 20 which provides an output, as shown by FIGURE 9, that is substantially the envelope of the signal which is, of course, the 40 cycle per second signal originally supplied by reference oscillator 10. This signal, when coupled to amplitude comparator 22 along with an inverted signal of the same frequency coupled from 180° phase shifter 26, as shown by FIGURE 10, provides a ready comparison of amplitudes.

It is to be realized, of course, that the signals coupled to comparator 22 may be made of the opposite phase for comparison purposes by inverting either the signal from the negative resistance amplifier or the signal from the reference oscillator itself.

Figure 11:
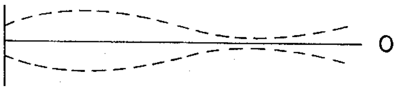
Figure 12:
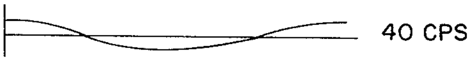

The output from comparator 22 is zero, as shown by the solid line of FIGURE 11, only if the signals are the same amplitude. If not of the same amplitude, the output, as shown by the dotted lines of FIGURE 11, will be the difference signal having the phase of the larger signal. The signal, if any, appearing at the output of amplitude comparator 22 is coupled to phase detector 11 along with a signal from the 40 cycle oscillator shifted in phase 90°, as shown by FIGURE 12.

Figure 13:
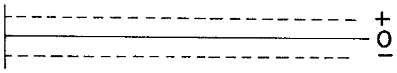

The D.C. output from the phase detector, after being coupled through low pass filter 36, will reflect the phase difference and be positive or negative depending upon whether the signal from comparator 22 is leading or lagging the phase shifted reference signal, as shown by the dotted lines of FIGURE 13. The output will be zero if no signal is coupled to the phase detector from reference network 22, as shown by the solid line of FIGURE 13.

Figure 2:
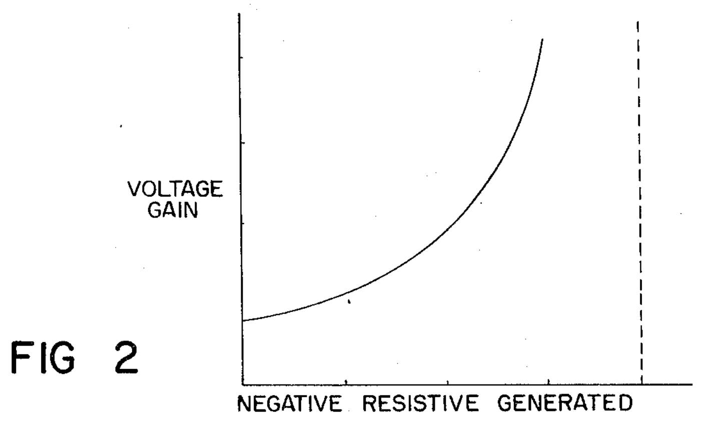
FIGURE 2 is a typical graph presentation illustrating the voltage gain characteristics of a negative resistance amplifier with respect to generated negative resistance.

The filtered D.C. signal from phase detector 11 is coupled to the signal attenuator 9 to raise or lower the D.C. level of the modulated signal and thus complete the feedback loop since raising or lowering the level has the effect of changing the negative resistance generated to thereby adjust the gain of the negative resistance amplifier as can be readily seen from FIGURE 2 of the drawings. When the gain has been adjusted sufficiently, the amplitude comparator will produce a zero output which, of course, results in no further adjustment of the gain. If the gain should again vary from the thus stabilized value, the stabilization network will again produce an error signal to return the gain to the value required for stabilization. It is therefore evident that any variations of output of amplifier 7 are utilized to change the gain of said amplifier so that said gain is held constant.

In addition to stabilizing the negative resistance amplifier for variations, such as instability of the control signal generator, the stabilizing network of this invention will also greatly reduce variations due to electrical transients, mechanical vibration and source impedance changes since the negative resistance amplifier is included within the stabilization loop and does not depend, for example, on stabiliaztion of the control signal generator.

In view of the foregoing, it should be evident to one skilled in the art that the network of this invention provides a heretofore unavailable means for effectively stabilizing the gain of a negative resistance amplifier.

I claim:

1. A gain stabilization network for a negative resistance amplifier comprising; input circuit means having a first, a second, and a third terminal; said first terminal receiving an input signal; said second terminal feeding said input signal to said amplifier, said second terminal also receiving the output from said amplifier, said output going to said third terminal through said input circuit means, said third terminal being connected to a control means, said control means being connected to amplifier gain varying means, said amplifier gain varying means controlling the gain of said amplifier according to signals received from said control means, so that the gain of said amplifier is held constant.

2. The gain stabilization network of claim 1 wherein said input circuit means is a circulator.

3. The gain stabilization network of claim 2 wherein said control means includes: a first and a second detector, said first detector receiving the output from said circulator through signal modifying means, a reference signal source, a comparator connected between said first and second detectors and to said reference source, said comparator feeding an error signal to said second detector when said reference signal differs from the signal from said first detector, said error signal being fed to said gain varying means so that the gain of said amplifier is held constant by said gain varying means in response to said error signal.

4. The network of claim 3 including a 180° phase shifter between said reference signal source and said comparator.

5. The network of claim 4 wherein said reference source is also connected to said second detector through a 90° phase shifter.

6. The network of claim 2 wherein said gain varying means includes a control signal generator actuating a signal attenuator, the output of said attenuator feeding said amplifier.

7. The network of claim 3 wherein said gain varying means includes a control signal generator actuating a signal attenuator, the output of said attenuator actuating said amplifier, said attenuator also receiving said error signal.

8. The network of claim 4 wherein said signal modifying means includes a converter and an IF amplifier connected between said circulator and said first detector.

9. The network of claim 5 wherein said signal modifying means includes a converter and an IF amplifier connected between said circulator and said first detector.

10. The network of claim 4 wherein said first detector is an amplitude detector, said second detector is a phase detector, said comparator is an amplitude comparator and said reference signal source is an oscillator.

11. The network of claim 5 wherein said first detector is an amplitude detector, said second detector is a phase detector, said comparator is an amplitude comparator and said reference signal source is an oscillator.

12. The network of claim 8 wherein said first detector is an amplitude detector, said second detector is a phase detector, said comparator is an amplitude comparator and said reference signal source is an oscillator.

13. The network of claim 9 wherein said first detector is an amplitude detector, said second detector is a phase detector, said comparator is an amplitude comparator and said reference signal source is an oscillator.

References Cited by the Examiner

UNITED STATES PATENTS 3,121,844 2/1964 Glomb ------------- 330—4.5

KATHLEEN H. CLAFFY, *Primary Examiner.*

WILLIAM C. COOPER, *Examiner.*

H. ZELLER, *Assistant Examiner.*